United States Patent [19]

Poduje et al.

[11] Patent Number: 4,918,376
[45] Date of Patent: Apr. 17, 1990

[54] A.C. CAPACITIVE GAUGING SYSTEM

[75] Inventors: Noel S. Poduje, Needham Heights; Roy S. Mallory, Bedford, both of Mass.

[73] Assignee: ADE Corporation, Newton, Mass.

[21] Appl. No.: 320,290

[22] Filed: Mar. 3, 1989

[51] Int. Cl.[4] .......................................... G01R 27/26
[52] U.S. Cl. ...................................... 324/663; 324/690
[58] Field of Search .................. 324/61 R, 61 P, 60 R

[56] References Cited

U.S. PATENT DOCUMENTS

| | | | |
|---|---|---|---|
| 3,048,775 | 8/1962 | Calvert | 324/61 R |
| 3,387,208 | 6/1968 | Foley | 324/60 R |
| 3,626,287 | 12/1971 | DiNiro | 324/61 R |
| 3,694,741 | 9/1972 | Abbe | 324/60 C |
| 3,706,919 | 12/1972 | Abbe | 317/246 |
| 3,771,051 | 11/1973 | Abbe | 324/61 R |
| 3,775,678 | 11/1973 | Abbe | 324/60 C |
| 3,775,679 | 11/1973 | Abbe | 324/61 R |
| 3,805,150 | 4/1974 | Abbe | 324/61 R |
| 3,812,424 | 5/1974 | Abbe | 324/61 R |
| 3,815,111 | 6/1974 | Abbe | 340/213 R |
| 3,986,109 | 10/1976 | Poduje | 324/61 R |
| 3,990,005 | 11/1976 | Abbe et al. | 324/61 R |
| 4,067,225 | 1/1978 | Dorman et al. | 324/61 R |
| 4,158,171 | 7/1979 | Abbe et al. | 324/158 R |
| 4,217,542 | 8/1980 | Abbe et al. | 324/61 R |
| 4,228,392 | 10/1980 | Abbe et al. | 324/61 R |
| 4,457,664 | 7/1984 | Judell et al. | 414/779 |
| 4,646,009 | 2/1987 | Mallory | 324/158 R |
| 4,692,695 | 9/1987 | Poduje | 324/158 R |
| 4,750,141 | 6/1988 | Judell et al. | 364/550 |

FOREIGN PATENT DOCUMENTS 8402780  1/1984  PCT Int'l Appl. .

Primary Examiner—Reinhard J. Eisenzopf
Assistant Examiner—Maura K. Regan
Attorney, Agent, or Firm—Weingarten, Schurgin, Gagnebin & Hayes

[57] ABSTRACT

A compensated capacitive probe system in which the probe and a guard ring are placed in the feedback path of an operational amplifier. An input signal is applied to the operational amplifier in combination with a portion of the guard signal. The resulting configuration compensates for stray capacitance at a measuring electrode of the probe and for the fact that the operational amplifier is other than mathematically ideal.

14 Claims, 2 Drawing Sheets

A.C. CAPACITIVE GAUGING SYSTEM

FIELD OF THE INVENTION

The instant invention is directed to the field of measurement and testing, and more particularly, to a novel improved A.C. capacitive probe system free from stray, fringe, and circuit limitations resulting from non-ideal effects.

BACKGROUND OF THE INVENTION

There are many systems in which a capacitive probe is employed to measure proximity from the probe to a reference surface of an object being measured. In such systems, use is made of the relation between measurement voltage and object distance that obtains in capacitive probes to provide the desired proximity gauging. Ideally, the relation is such that changes in the measured voltage bear a simple mathematical relationship to changes in the physical distance between the probe and the reference surface of the object. In real capacitive gauging systems, however, such effects as stray capacitance, fringe capacitance and non-ideal circuitry cause a departure from the simple relation, which adversely impacts data accuracy.

SUMMARY OF THE INVENTION

The present invention contemplates as its principal object an A.C. capacitive gauging system whose output is proportional to proximity notwithstanding fringe and stray capacitances and circuit non-idealities. The present invention is based in the recognition that both the fringe and stray capacitances that are introduced at the capacitive proximity probe as well as circuit non-idealities exhibit as an additive term to the ideal distance to output voltage relation. In accordance therewith, the present invention discloses circuit means for effecting the subtraction of a compensation signal precisely equal to that term in real time from the probe signal so that the ideal distance to output voltage relation is thereby realized and data accuracy is enhanced. In the preferred embodiment of the present invention, operational amplifier circuit means provide a negative feedback signal that precisely cancels the additive term induced by the stray and fringe capacitances and compensates for circuit non-idealities.

The improved capacitive probe of the present invention operates in A.C., and, as such, is comparatively easy to control both in current and in phase. The probe preferably includes a central capacitive sensing element around which a coaxial guard is provided. The guard and capacitive sensing element are driven at the same A.C. voltage and phase but from different portions of the circuit. The output is typically taken at the guard voltage.

BRIEF DESCRIPTION OF THE DRAWINGS

These and other objects, aspects, and advantages of the instant invention will become apparent as the invention becomes better understood by referring to the following solely exemplary detailed description thereof, and to the drawings, wherein.

DETAILED DESCRIPTION OF THE INVENTION

Figure 1:
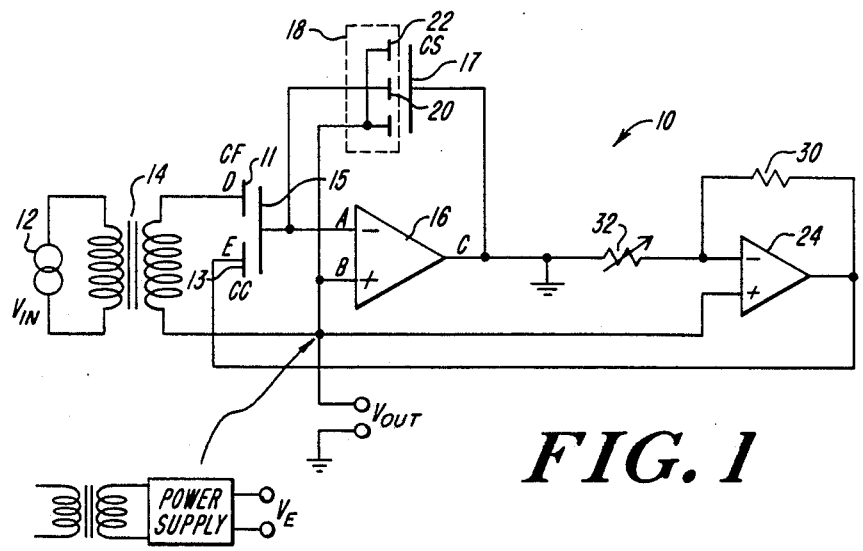
FIG. 1 is a circuit diagram of the A.C. capacitive probe system of the instant invention.

Referring now to the FIG. 1, generally designated at 10 is the A.C. capacitive probing system of the present invention. The system 10 includes an A.C. driver 12 designated "$V_{IN}$" coupled in the primary windings of a transformer 14. The secondary windings of the transformer 14 drive plate 11 of a three plate input and feedback capacitor and applies the input across a capacitor designated "CF" formed by plate 11 and a plate 15. An operational amplifier 16 has its inverting input designated "A" connected to the plate 15 of capacitor CF and has its output designated "C" grounded. An element 17 to be capacitively gauged is connected to ground and thus the output of amplifier 16. A capacitive probe, generally designated 18, to be described, has a central capacitive plate 20 connected to the inverting input of amplifier 16. A guard plate 22 is connected to the non-inverting input of the amplifier 16 which is virtually at the same voltage as the inverting input.

Figure 2:
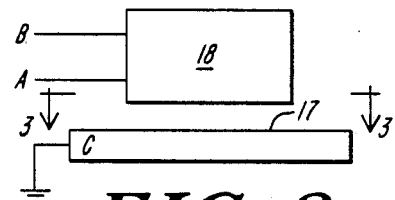
FIG. 2 is a pictorial diagram illustrating use of the probe with an object such as a semiconductor wafer to be measured.
Figure 3:
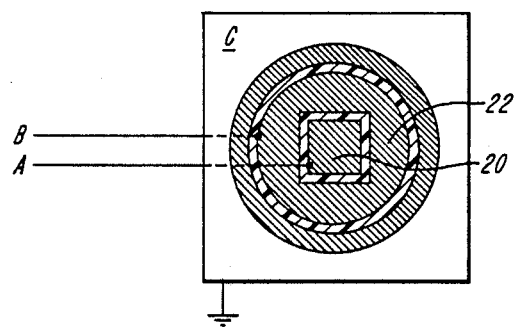
FIG. 3 is a plan view along the lines 3, 3 of FIG. 2.

The probe 18 is brought into proximity with an element 17, typically a semiconductor wafer to be gauged as shown in FIG. 2. The probe 18 as shown in FIG. 3 in one embodiment includes central plate 20 and coaxially surrounding guard 22. The central plate 20 is shaped in any form desired, such as a square or a rectangle, for the application. The coaxially surrounding guard 22 shapes the field lines at the central plate 20 to minimize fringe capacitance. The central plate 20, the grounded element 17 the distance to which is to be gauged, and the interspace therebetween constitute the operative sensing capacitance designated "CS". These may be formed on a printed circuit board or as components in a probe housing.

Figure 4:
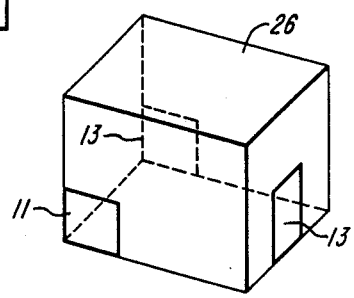
FIG. 4 is a perspective view of the precise combination input and feedback coupling capacitor of the A.C. capacitive gauging system of the instant invention

An operational amplifier 24 having a negative feedback resistor 30 has its inverting input connected to the output of the first amplifier 16 and circuit ground via a variable resistor 32. The output of the amplifier 24 is fed back to the inverting input of the amplifier 16 via a capacitor "CC" comprising plate 15 and a plate 13 of the three plate capacitor. To ensure proper operation, it is important that the capacitors CF and CC be precision capacitors. To this end, the input and feedback capacitors CF and CC may be formed on a monolithic dielectric body, generally designated 26 in FIG. 4, such as quartz or plastic. Metallization electrodes are deposited on the surfaces thereof to form the plates 11, 13 and 15. The system output is taken between the noninventing input of amplifier 16 and ground.

In operation, the product of the input voltage, $V_{IN}$, with the capacitance CF is equal to the product of the output voltage, $V_{OUT}$ (at the non-inverting input of the amplifier 16), with the capacitance CS minus the product of the output voltage with the amplifier 24 gain, A, and with the feedback capacitance, CC, thusly:

$$V_{IN}CF = V_{OUT}CS - V_{OUT}(A)(CC)$$

The capacitance of the probe, CS, is equal to the product of the area, A, of the central plate 20 with the constant $\epsilon_0$, divided by the distance, d, between the plates, plus a term, $C_o$, representative of stray and fringe capacitance as well as a term reflecting the departure of the amplifier 16 from the ideal of infinite gain, thus: $CS = A\epsilon_o/d + C_o$. The output voltage, $V_{out}$, then by substitution and rearrangement is as follows:

$$V_{OUT} = (V_{IN}CF)/((\epsilon_o A/d) + C_o - (A)(CC))$$

The negative feedback signal, $(A)(CC)$, is set to be exactly equal to the net $C_o$ term by adjusting resistor 32, whereby a more precisely proportional voltage to distance relation is obtained in real time, and data accuracy is improved. In order to cause the product of the capacitance CC with the gain A to be equal to the net $C_o$, resistor 32 is varied until optimal error cancellation occurs using standard calibration techniques, using one or more known references.

Figure 5:
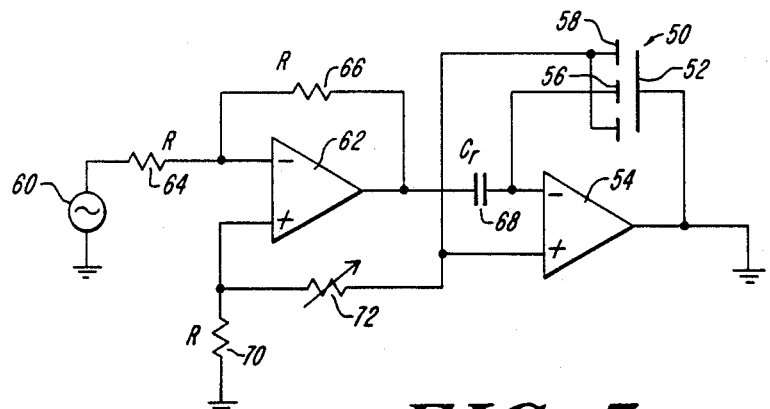
FIG. 5 is a circuit diagram of an alternative feedback compensating probe.
Figure 1:
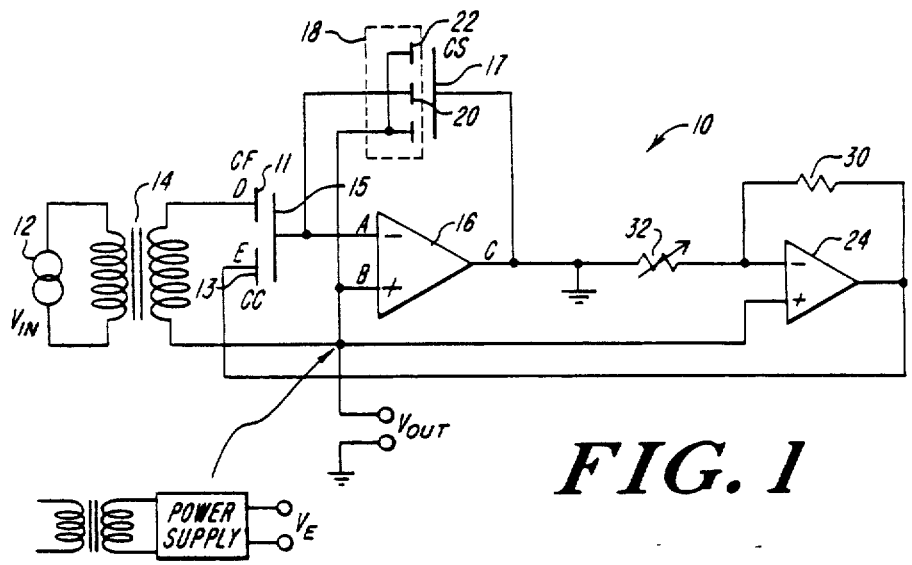
Figure 2:
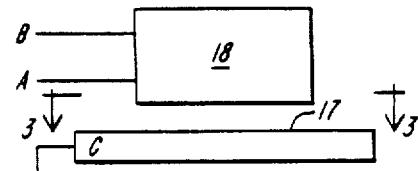
Figure 3:
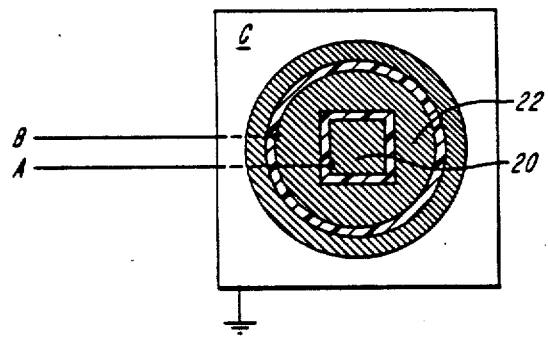
Figure 4:
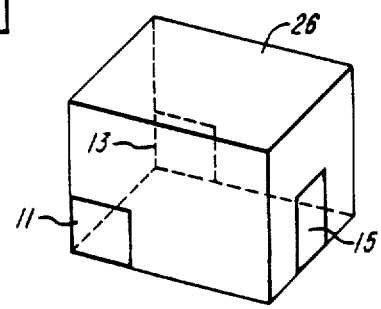

An alternative feedback system is shown in FIG. 5 which uses an operational amplifier to sum the input and feedback that was previously accomplished by a transformer and three plate capacitor. The FIG. 5 circuitry nevertheless still provides compensation for error terms resulting from real world components. Shown in FIG. 5 is a gauging probe 50 having a grounded plate 52, also connected to the output of an operational amplifier 54. A central electrode 56 of the probe 50 is connected to the inverting input of the amplifier 54 while a guard electrode 58 is connected to the non-inverting input.

A source 60 of A.C. excitation is connected between ground and the inverting input of an operational amplifier 62 through a resistor 64. Amplifier 62 has a negative feedback resistor 66 between its output and the inverting input of amplifier 62. The output of the amplifier 62 is coupled through a reference capacitor 68 to the inverting input of the amplifier 54. The non-inverting input of amplifier 62 is connected to ground through a resistor 70 and through a variable resistor 72 to the non-inverting input of amplifier 54.

The mathematics referenced above are applicable to the circuitry of FIG. 5. The resistor 72 is adjusted to compensate out the error terms.

Other modifications of the presently disclosed invention will become apparent to those skilled in the art without departing from the inventive concept.

What is claimed is:

1. A compensated capacitive probe system comprising:
    an operational amplifier;
    a probe having a measuring plate, and forming with an object to be capacitively gauged a feedback path from an output to an inverting input of said operational amplifier, said plate having a guard plate;
    first means for driving said guard plate with a voltage held at the voltage of said measuring plate by said operational amplifier;
    second means for driving said operational amplifier at its inverting input with an input signal;
    means for coupling across physically separated conductors and into said input signal a portion of the signal at said guard plate which compensates for both stray capacitance of said measuring plate and departure of said operational amplifier from mathematically ideal conditions.

2. The system of claim 1 further including:
    means for inductively coupling said input signal to said operational amplifier.

3. The system of claim 1 wherein said coupling and second driving means includes separate plates of a 3-plate coupling capacitor.

4. The system of claim 1 wherein said probe includes a unitary element.

5. A compensated capacitive probe system comprising:
    an operational amplifier;
    a probe having a measuring plate and forming with an object to be capacitively gauged a feedback path from an output to an inverting input of said operational amplifier;
    said plate having a guard plate;
    first means for driving said guard plate with a voltage held at the voltage of said measuring plate by said operational amplifier;
    second means for driving said operational amplifier at its inverting input with an input signal;
    means for coupling through an amplifier and into said input signal a portion of the signal at said guard plate which compensates for both stray capacitance of said measuring plate and departure of said operational amplifier from mathematically ideal conditions.

6. The system of claim 5 further including:
    means for actively coupling said input signal to said operational amplifier.

7. The system of claim 5 wherein said coupling and second driving means includes separate inputs of an operational amplifier.

8. The system of claim 5 wherein said probe includes a unitary element.

9. A gauging method comprising the steps of:
    capacitively coupling a first signal between a first electrode and a semiconductor wafer;
    placing a guard electrode around said first electrode;
    capacitively coupling a second signal between said guard electrode and said wafer;
    developing said second signal to be virtually the same, but not exactly the same as said first signal by respectively connecting said first and guard electrodes to inverting and noninverting inputs of an operational amplifier and connecting said wafer to an output of said operational amplifier;
    coupling into said inverting input a portion of the signal at said noninverting input to compensate for non ideal conditions of said operational amplifier.

10. A device for measuring the distance from a capacitive probe to an object of interest comprising:
    first operational amplifier means;
    capacitive probe means including first and second electrodes connected to an inverting and a non-inverting input, respectively, of said first operational amplifier means,
    said object of interest being connected to a circuit ground in common with the output of said first operational amplifier means, and being disposed in proximity to said capacitive probe means so as to form a capacitive gap between said object and said first electrode, thereby completing a feedback path between said inverting input and said output of said first operational amplifier means;
    capacitor means having a first plate connected to the inverting input of said first operational amplifier means;
    a second operational amplifier having an inverting input connected to an output thereof via an electrical resistance element, and having said output thereof connected to a second plate of said capacitor means;

variable electrical resistance means connected to an input of said second operational amplifier and adapted to apply thereto a current operative to make a signal at said non-inverting input of said first operational amplifier follow proportionately said gap.

11. The device of claim 10, wherein said first and second electrodes include a measuring plate and a guard plate, respectively.

12. The device of claim 10, wherein said capacitor means is a three-plate capacitor.

13. The device of claim 10, wherein said capacitor means is a two plate capacitor.

14. The device of claim 12, wherein said three-plate capacitor means is formed on a monolithic body.

* * * * *

UNITED STATES PATENT AND TRADEMARK OFFICE
CERTIFICATE OF CORRECTION

PATENT NO.　:　4,918,376

DATED　　　:　April 17, 1990

INVENTOR(S) :　Noel S. Poduje, et al.

It is certified that error appears in the above-identified patent and that said Letters Patent is hereby corrected as shown below:

Title Page:
In the line identified as [22], after "Filed:", the filing date should read --March 7, 1989--.

Sheet 1 of 2 in the issued patent consisting of Fig. 1, Fig. 2, Fig. 3, and Fig. 4, should be replaced with the new corrected Sheet 1 of 2 attached herewith, to correct the second occurrence of plate 13 to plate 15.

Signed and Sealed this

Twenty-fifth Day of August, 1992

Attest:

DOUGLAS B. COMER

*Attesting Officer*　　*Acting Commissioner of Patents and Trademarks*